(12) United States Patent
Kawamata

(10) Patent No.: US 8,137,511 B2
(45) Date of Patent: Mar. 20, 2012

(54) FILM FORMING APPARATUS AND FILM FORMING METHOD

(75) Inventor: Yoshio Kawamata, Kanagawa-ken (JP)

(73) Assignee: Shibaura Mechatronics Corporation, Kanagawa-Ken (JP)

( * ) Notice: Subject to any disclaimer, the term of this patent is extended or adjusted under 35 U.S.C. 154(b) by 625 days.

(21) Appl. No.: 12/305,711

(22) PCT Filed: Jun. 6, 2007

(86) PCT No.: PCT/JP2007/061455
§ 371 (c)(1),
(2), (4) Date: Dec. 19, 2008

(87) PCT Pub. No.: WO2007/148536
PCT Pub. Date: Dec. 27, 2007

(65) Prior Publication Data
US 2010/0230273 A1  Sep. 16, 2010

(30) Foreign Application Priority Data

Jun. 22, 2006 (JP) ................. 2006-172777

(51) Int. Cl.
C23C 14/35 (2006.01)
C23C 14/00 (2006.01)

(52) U.S. Cl. ......... 204/192.12; 204/298.08; 204/298.28

(58) Field of Classification Search ............. 204/192.12, 204/192.17, 192.3, 298.03, 298.06, 298.16, 204/298.2
See application file for complete search history.

(56) References Cited

U.S. PATENT DOCUMENTS
2005/0133361 A1 * 6/2005 Ding et al. ............... 204/192.12

FOREIGN PATENT DOCUMENTS
| JP | 58-110671 A | 7/1983 |
| JP | 2004-010905 A | 1/2004 |
| JP | 2004-156122 A | 6/2004 |
| JP | 2005-187830 A | 7/2005 |

OTHER PUBLICATIONS

Chinese Office action for 200780023056.7 dated Oct. 25, 2010.
International Search Report for PCT/JP2007/061455 dated Aug. 8, 2007.

* cited by examiner

Primary Examiner — Stephen Rosasco
(74) Attorney, Agent, or Firm — Pearne & Gordon LLP

(57) ABSTRACT

A film forming apparatus and a film forming method includes: a vacuum chamber; a holder for a film formation object, the holder being rotatably provided in the vacuum chamber; and a sputter source capable of holding a plurality of targets, the sputter source being spinnably provided so that the opposed area of the target with respect to the film formation object can be varied. They can perform uniform and efficient film formation in accordance with the size of a film formation object using a simple configuration, with less possibility of contamination and easy maintenance.

10 Claims, 11 Drawing Sheets

FILM FORMING APPARATUS AND FILM FORMING METHOD

TECHNICAL FIELD

This invention relates to a film forming apparatus and a film forming method, and more particularly to a film forming apparatus in which a film formation object is subjected to film formation while passing through a position opposed to a sputter target, and a film forming method based on this apparatus.

BACKGROUND ART

In a film forming apparatus in which a film formation object is subjected to film formation while passing through a position opposed to a sputter target, if the size of the film formation object is large relative to the target, the film fails to be formed on the outer periphery side, and the film thickness distribution is degraded. On the other hand, if the size of the film formation object is small relative to the target, the amount of film attached to portions other than the film formation object in the vacuum chamber increases, and hence the film formation efficiency decreases. Furthermore, attached matter in the vacuum chamber, if stripped off, contaminates the film formation object, and to prevent this, the inside of the vacuum chamber needs to be further cleaned, which requires time and effort.

Patent Document 1 discloses performing sputtering while a sputter cathode holding a target is rotated with respect to substrates, or performing sputter film formation on the substrates for a prescribed time with the sputter cathode stopped at a prescribed position, followed by rotating the sputter cathode to change its position and performing sputter film formation again on the substrates.

However, in Patent Document 1, as shown in FIG. 2 thereof, one circular target is held on the sputter cathode, but the target is not configured to simultaneously cover all the regions subjected to film formation (entire surface of two substrates). In the case of performing sputter film formation on the substrates while rotating the target about an axis eccentric to its center so that the entire surface of two substrates is opposed to the target, the sputter cathode is constantly rotated during film formation. This also needs to rotate the power supply line, and the refrigerant supply line for cooling the target. Thus, a special configuration is needed to prevent kinks and breaks due to these rotations.

Patent Document 1: JP-A-2005-187830

DISCLOSURE OF INVENTION

Problems to be Solved by the Invention

This invention provides a film forming apparatus and a film forming method that can perform uniform and efficient film formation in accordance with the size of a film formation object using a simple configuration, with less possibility of contamination and easy maintenance.

Solution to the Problems

According to an aspect of the invention, there is provided a film forming apparatus including: A rotary table having a holder for a film formation object and rotatably provided in a vacuum chamber; and a sputter source spinnably provided at a position opposed to a moving path of the holder moved by rotation of the rotary table and holding a plurality of targets, setting a spin angle of the sputter source so that the plurality of targets are arranged in the moving direction of the film formation object when the film formation object is small relative to the target, and setting a spin angle of the sputter source so that the plurality of targets are arranged in the direction crossing the moving direction of the film formation object when the film formation object is large relative to the target.

According to another aspect of the invention, there is provided a film forming apparatus including: A rotary table having a holder for a film formation object and rotatably provided in a vacuum chamber; and a sputter source spinnably provided at a position opposed to a moving path of the holder moved by rotation of the rotary table and holding a target shaped like an ellipse or a polygon having sides different in length, setting a spin angle of the sputter source so that the longitudinal direction of the target is relatively parallel or nearly parallel to the moving direction of the film formation object when the film formation object is small relative to the target, and setting a spin angle of the sputter source so that the longitudinal direction of the target is relatively perpendicular or nearly perpendicular to the moving direction of the film formation object when the film formation object is large relative to the target.

According to still another aspect of the invention, there is provided a film forming method holding a film formation object on a holder of a rotary table rotatably provided in a vacuum chamber and performing a film formation on the film formation object using a sputter source spinnably provided at a position opposed to a moving path of the holder moved by rotation of the rotary table, including: changing a relative angle between the moving direction of the film formation object and the arrangement direction of a plurality of targets by holding the plurality of targets on the sputter source and causing the sputter source to spin; causing the plurality of targets to be arranged in the moving direction of the film formation object when the film formation object held on the holder is small relative to the target; and causing the plurality of targets to be arranged in the direction crossing the moving direction of the film formation object when the film formation object held on the holder is large relative to the target.

According to still another aspect of the invention, there is provided a film forming method holding a film formation object on a holder of a rotary table rotatably provided in a vacuum chamber and performing film formation on the film formation object using a sputter source spinnably provided at a position opposed to a moving path of the holder moved by rotation of the rotary table, including; changing a relative angle between the moving direction of the film formation object and the longitudinal direction of a target shaped like an ellipse or a polygon having sides different in length by holding the target on the sputter source and causing the sputter source to spin; causing the longitudinal direction of the target to be relatively parallel or nearly parallel to the moving direction of the film formation object when the film formation object held on the holder is small relative to the target; and causing the longitudinal direction of the target to be relatively orthogonal or nearly orthogonal to the moving direction of the film formation object when the film formation object held on the holder is large relative to the target.

Figure 1:
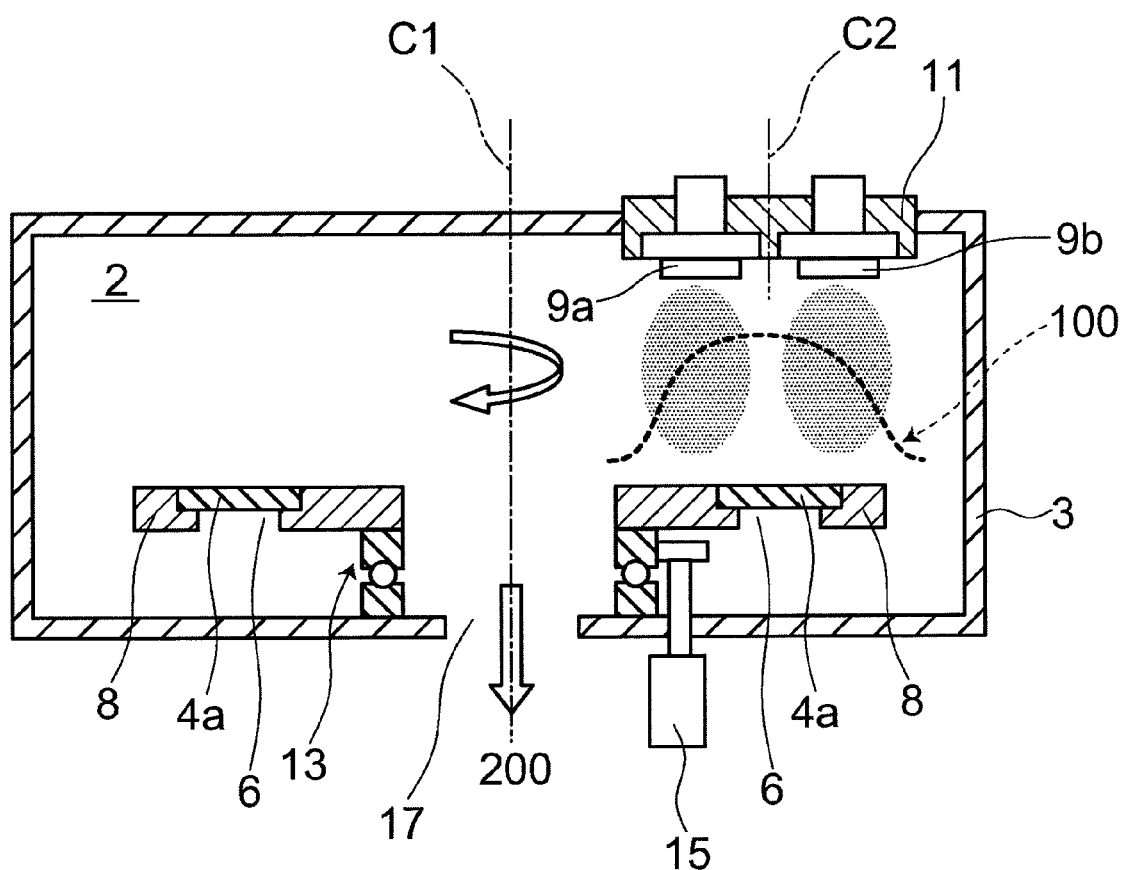
FIG. 1 is a schematic cross-sectional view of a film forming apparatus according to a first embodiment of the invention.

| Description of reference numerals | |
|---|---|
| 2 | vacuum chamber |
| 3 | airtight container |
| 4a-4c | film formation object |
| 6 | film formation object holder |
| 8 | rotary table |
| 9a-9d | target |
| 11 | sputter source |
| 18 | rotary table |
| 100 | film thickness distribution |
| 110 | film formation area |
| 120 | area in which a wasteful film is formed |
| 200 | evacuation |

BEST MODE FOR CARRYING OUT THE INVENTION

Embodiments of the invention will now be described with reference to the drawings. In the drawings, like components are labeled with like reference numerals.

First Embodiment

FIG. 1 is a schematic cross-sectional view of a film forming apparatus according to a first embodiment of the invention.

Figure 2:
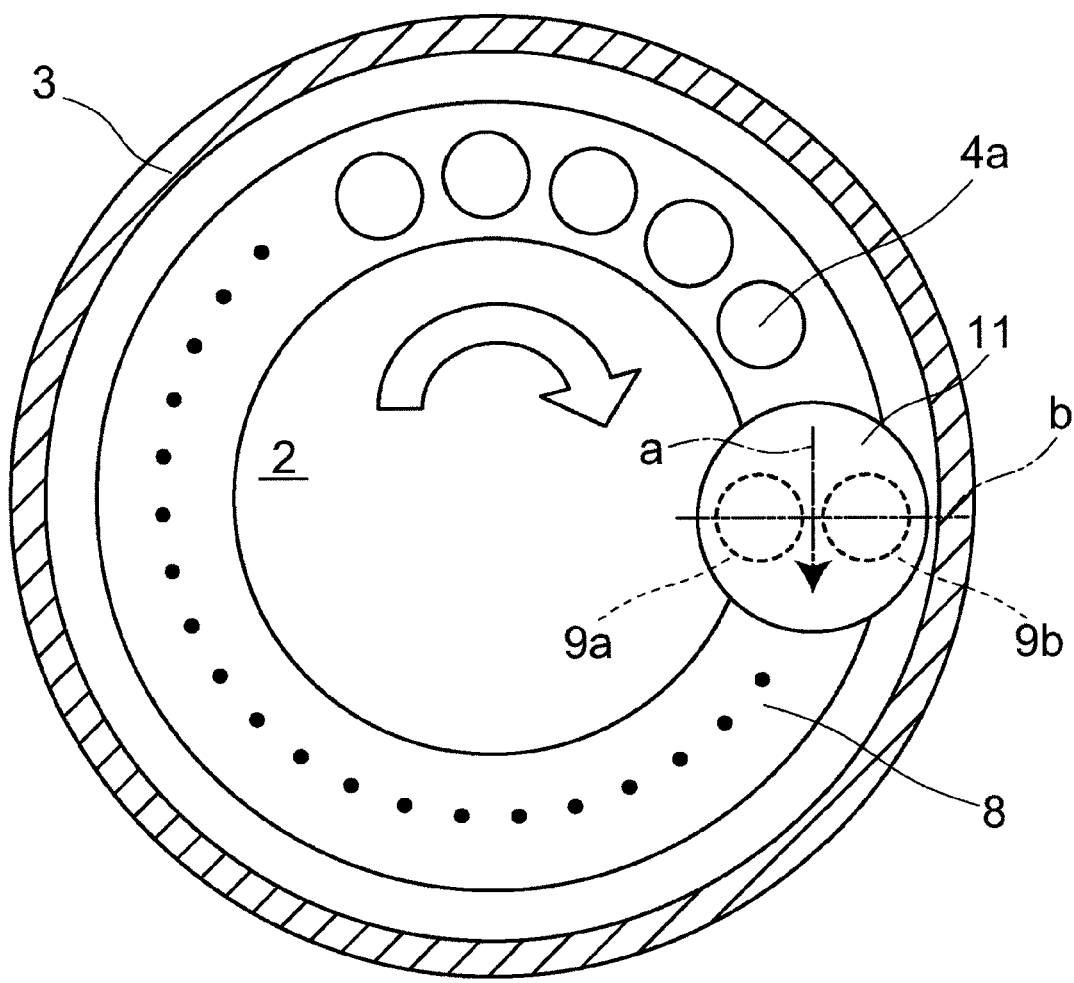
FIG. 2 is a schematic view showing the planar positional relationship between the rotary table and the sputter source in this film forming apparatus.

FIG. 2 is a schematic view showing the planar positional relationship between the rotary table and the sputter source in this film forming apparatus.

Figure 3:
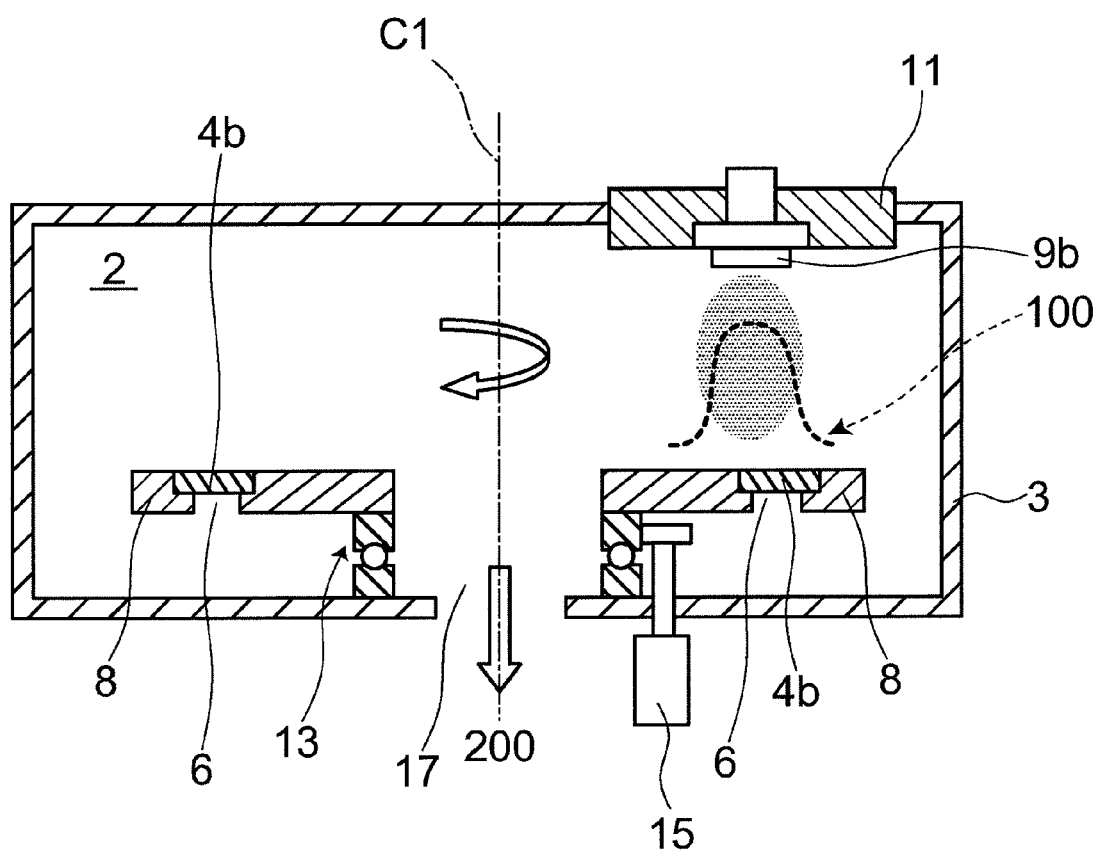
FIG. 3 is a figure corresponding to FIG. 1 and showing the case of performing film formation on a film formation object which is smaller in size (diameter) than that in FIG. 1.

FIG. 3 is a figure corresponding to FIG. 1 and showing the case of performing film formation on a film formation object which is smaller in size (diameter) than that in FIG. 1.

Figure 4:
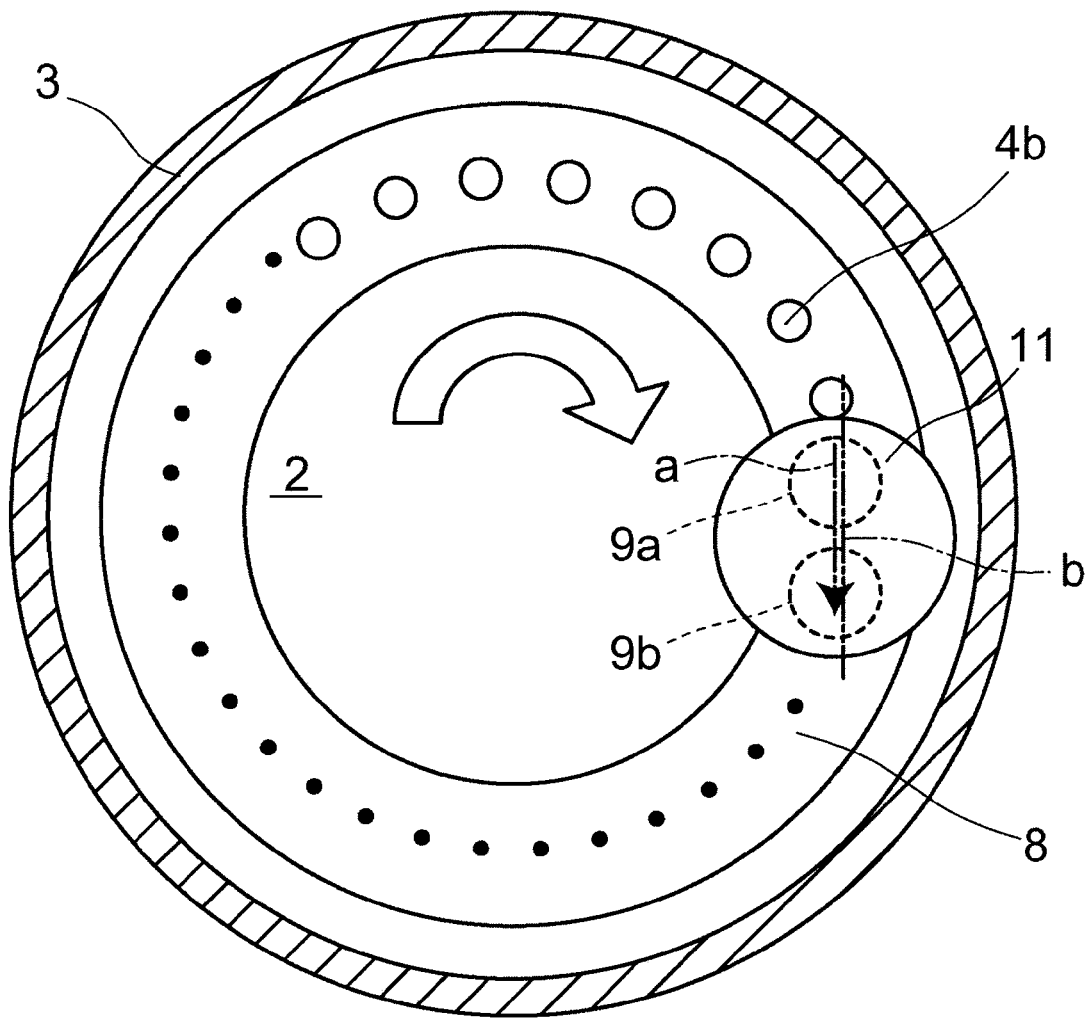
FIG. 4 is a figure corresponding to FIG. 2 and showing the case of performing film formation on a film formation object which is smaller in size (diameter) than that in FIG. 2.

FIG. 4 is a figure corresponding to FIG. 2 and showing the case of performing film formation on a film formation object which is smaller in size (diameter) than that in FIG. 2.

The film forming apparatus according to this embodiment includes an airtight container 3 in which a vacuum chamber 2 is formed. An evacuation port 17 is formed at the bottom center of the airtight container 3. The pressure in the vacuum chamber 2 is reduced by performing evacuation 200 through a vacuum evacuation system, not shown, connected to this evacuation port 17.

A rotary table 8 is rotatably provided through a rotary bearing 13 at the bottom in the vacuum chamber 2. The rotary table 8 is illustratively shaped like a doughnut, and its central hole is located above the evacuation port 17. The rotary table 8 rotates about the center C1 in response to a rotation driving force from a motor 15.

The rotary table 8 includes a plurality of film formation object holders 6 provided along the circumferential direction. A film formation object 4a, 4b such as a semiconductor wafer and a glass substrate is held on the holder 6. The film formation object 4a, 4b held on the holder 6 moves in the vacuum chamber 2 along a circular trajectory by rotation of the rotary table 8.

A sputter source 11 is provided in the upper wall (upper lid) of the airtight container 3. The sputter source 11 is provided with a backing plate for holding a plurality of targets 9a, 9b, and an electrode for applying electric power to the targets 9a, 9b, and also suitably provided with a magnet and a cooling mechanism as needed. The target 9a, 9b is made of a film formation material to be formed on the film formation object 4a, 4b, and illustratively shaped like a disk.

The sputter source 11 is spinnably provided at a position opposed to the moving path of the film formation object holder 6 moving by rotation of the rotary table 8. That is, the sputter source 11 is rotatable about its own central axis C2. The target 9a, 9b faces the inside of the vacuum chamber 2, and is opposed to the moving path of the holder 6 and the film formation object 4a, 4b held thereon. The targets 9a, 9b are placed across the spinning center C2 of the sputter source 11. It is noted that the spinning center of the sputter source 11 may be offset from its own central position, and is not limited to being located at the central position between the two targets 9a, 9b.

It is noted that a plurality of sputter sources may be provided along the moving path of the film formation object holder 6. The number of targets provided on one sputter source may be three or more. As an alternative configuration, the plurality of targets may be made of different materials to form a composite film, or a multilayer film of different materials, on the film formation object.

When the rotary table 8 is rotated, the film formation object 4a, 4b held on the holder 6 is moved along a circular trajectory. When the film formation object passes through a position opposed to the sputter source 11, it is subjected to film formation by particles sputtered from the targets 9a, 9b and attached thereto. The film thickness distribution 100 thereof is as illustrated.

Figure 5:
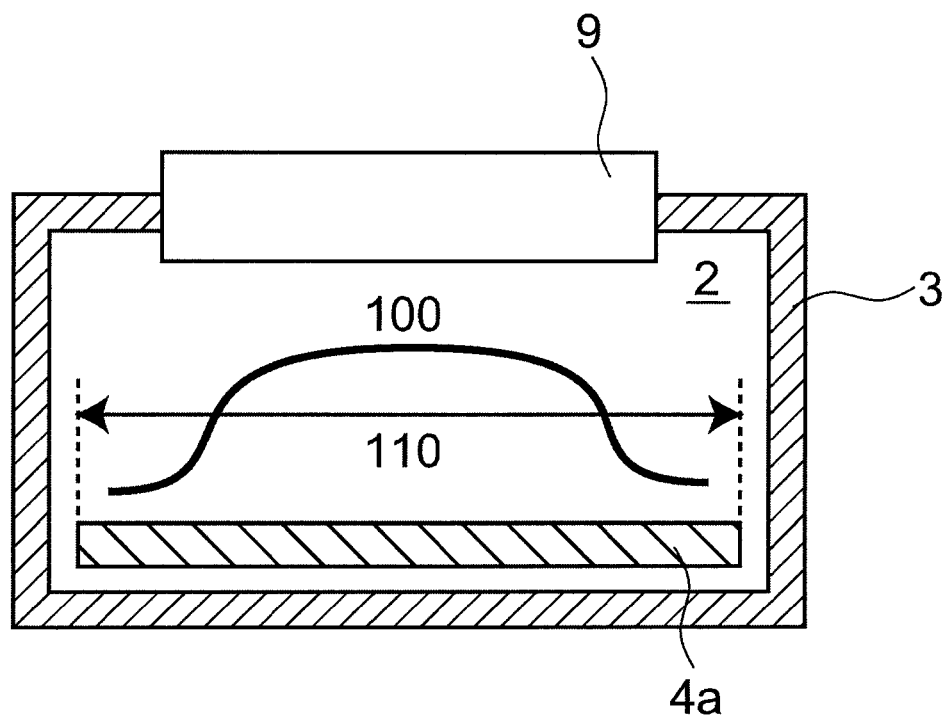
FIG. 5 is a schematic view showing a film thickness distribution (thick solid line) in the case where the size (planar dimension) of the film formation object is large relative to the size (planar dimension) of the target.

FIG. 5 is a schematic view showing a film thickness distribution (thick solid line) 100 in the case where the size (planar dimension), or film formation area 110, of the film formation object 4a is large relative to the size (planar dimension) of the target 9.

If the size of the film formation object 4a is large relative to the target 9, the film fails to be formed on the outer peripheral portion of the film formation object 4a that is not opposed to the target 9, and the in-plane uniformity of film thickness is degraded.

Figure 6:
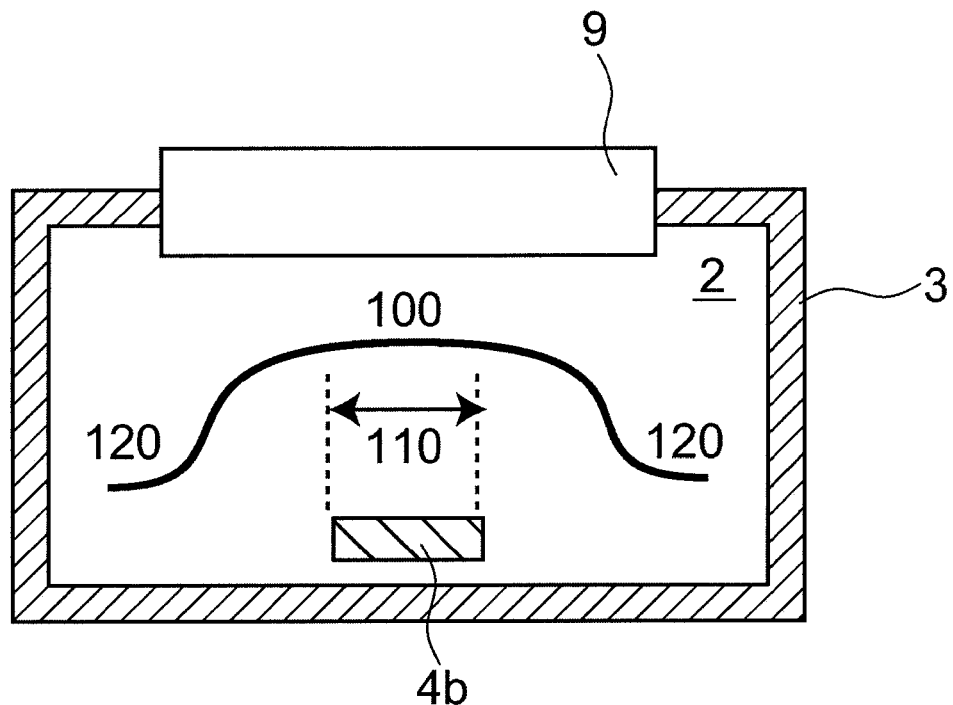
FIG. 6 is a schematic view showing a film thickness distribution (thick solid line) in the case where the size (planar dimension) of the film formation object is small relative to the size (planar dimension) of the target.

FIG. 6 is a schematic view showing a film thickness distribution (thick solid line) 100 in the case where the size (planar dimension), or the film formation area 110, of the film formation object 4b is small relative to the size (planar dimension) of the target 9.

If the size of the film formation object 4b is small relative to the target 9, the area 120 in which a wasteful film is formed increases. That is, the amount of wasteful film attached to portions other than the film formation object 4b increases and results in poor utilization efficiency of the target 9. Furthermore, attached matter in the vacuum chamber 2, if stripped off, contaminates the film formation object, and to prevent this, the inside of the vacuum chamber 2 needs to be further cleaned, which requires time and effort.

If targets with a plurality of sizes are prepared in accordance with the size of the film formation object and exchanged to perform film formation on film formation objects having different sizes, much time and effort are required and result in decreased production efficiency and increased cost.

Thus, in this embodiment, the target area facing the film formation object can be varied by rotating (spinning) the sputter source 11.

In the case of performing film formation on a film formation object 4a having a relatively large size, as shown in FIG. 2, the line b connecting the centers of the two targets 9a, 9b is caused to cross (illustratively, in FIG. 2, to be generally orthogonal to) the moving direction a of the film formation object 4a passing below the sputter source 11.

Hence, the targets 9a, 9b are opposed also to the outer peripheral portion of the film formation object 4a. Thus, the film thickness distribution 100 as shown by the dashed line in FIG. 1 is obtained, and the in-plane uniformity of film thickness on the film formation object 4a is improved.

On the other hand, in the case of performing film formation on a film formation object 4b having a relatively small size, as shown in FIG. 4, the line b connecting the centers of the two targets 9a, 9b is made generally parallel to the moving direction a of the film formation object 4b passing below the sputter source 11.

Hence, the target area opposed to the outside of the film formation object 4b can be reduced. Thus, as in the film thickness distribution 100 shown by the dashed line in FIG. 3, the wasteful film attached to portions other than the film formation object 4b can be decreased, and the utilization efficiency of the target is improved. This can also prevent contamination in the vacuum chamber 2 due to the film attached to portions other than the film formation object 4b, and reduce the frequency, time, and effort of maintenance. Furthermore, the film formation object 4b moves a long distance below the targets 9a, 9b and can be opposed to the targets 9a, 9b for a long period of time. Hence, the film formation rate can be increased.

Figure 16:
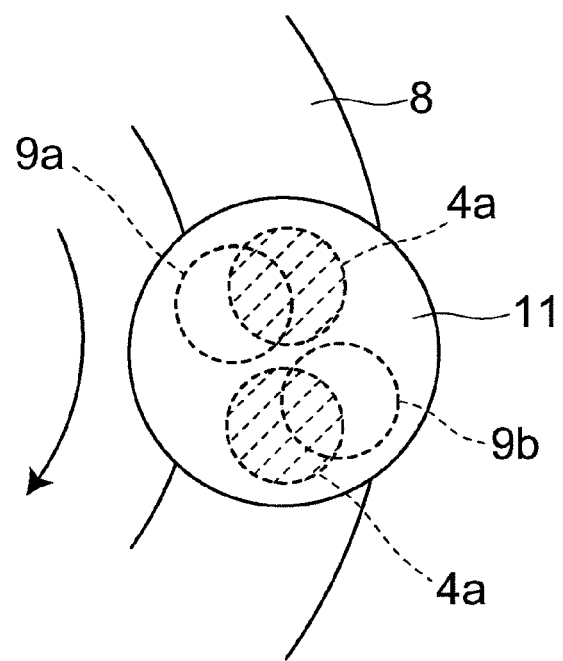
FIG. 16 is a schematic view showing another specific example of the placement relationship of the target and the film formation object in the film forming apparatus according to the first embodiment.

It is noted that the invention is not limited only to the situations shown in FIGS. 2 and 4. More specifically, as shown in FIG. 16, the situation in which the line connecting the centers of the two targets 9a, 9b is neither generally perpendicular nor generally parallel, but oblique to the moving direction of the film formation object 4a, is also encompassed within the scope of the invention. The angle between the moving direction of the film formation object and the line connecting the centers of the two targets 9a, 9b can be suitably determined in accordance with the size of the film formation object. As the size of the film formation object becomes larger, the moving direction of the film formation object and the line connecting the centers of the two targets 9a, 9b can be made closer to orthogonality. On the other hand, as the size of the film formation object becomes smaller, the moving direction of the film formation object and the line connecting the centers of the two targets 9a, 9b can be made closer to parallelism. That is, for an intermediate size of the film formation object, the moving direction of the film formation object and the line connecting the centers of the two targets 9a, 9b may be neither parallel nor orthogonal.

Rotation of the sputter source 11 may be performed whether under atmospheric pressure or under reduced pressure in the vacuum chamber 2, and whether a film formation object is present or absent in the vacuum chamber 2. Furthermore, rotation of the sputter source 11 may be performed whether manually or automatically.

As described above, according to this embodiment, the target area facing the film formation object can be varied using a simple configuration of rotating (spinning) the sputter source 11 provided with a plurality of targets in accordance with the size of the film formation object. Hence, there is no need to prepare targets with a plurality of sizes in accordance with the size of the film formation object, or to exchange such targets to perform film formation on film formation objects having different sizes. Thus, the decrease of production efficiency and the increase of cost can be prevented.

On the other hand, because the perimeter of the rotary table 8 is longer along the outer periphery side than along the inner periphery side, the film formation object passes below the sputter source 11 more rapidly on the outer periphery side than on the inner periphery side, and the film formation rate is lower on the outer periphery side than on the inner periphery side. That is, the film thickness tends to be thinner on the outer periphery side.

Figure 7:
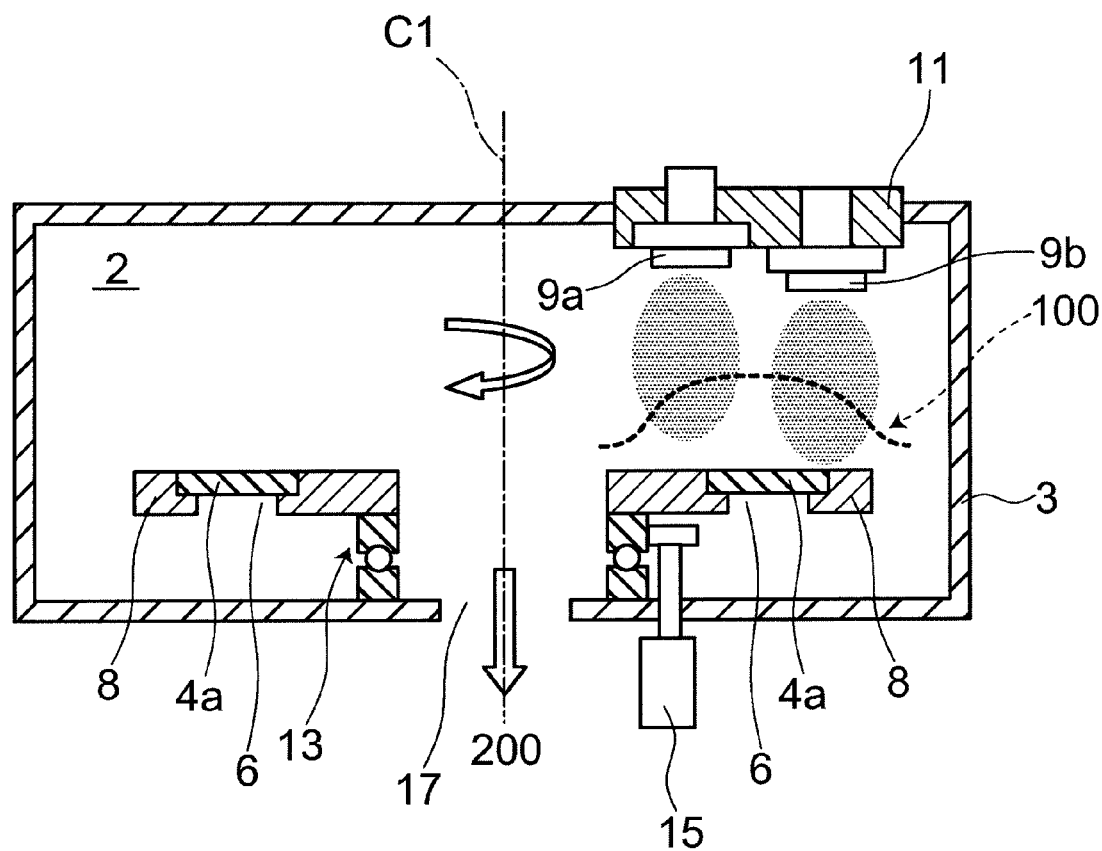
FIG. 7 is a schematic view showing a specific example which the plurality of targets held on the sputter source are placed so that the target opposed to the outer periphery side of the film formation object is brought nearer to the film formation object than the target opposed to the inner periphery side of the film formation object.

To prevent this, as shown in FIG. 7, it is useful that the plurality of targets held on the sputter source 11 are placed so that the target 9b opposed to the outer periphery side of the film formation object 4a is brought nearer to the film formation object 4a than the target 9a opposed to the inner periphery side of the film formation object 4a.

This increases the rate at which particles sputtered from the target 9b reach the outer periphery side of the film formation object 4a, and as shown by the dashed line in FIG. 7, the film thickness distribution 100 can be made uniform throughout the inner periphery side and the outer periphery side.

Alternatively, the electric power applied to the targets 9a, 9b may be made controllable for each target so that the electric power applied to the target 9b opposed to the outer periphery side of the film formation object 4a is made higher than the electric power applied to the target 9a opposed to the inner periphery side of the film formation object 4a, thereby achieving the in-plane uniformity of film thickness.

In the case where the distance between the target and the film formation object on the inner periphery side and that on the outer periphery side are made different to achieve the in-plane uniformity of film thickness, the electric power applied to the two targets 9a, 9b does not need to be separately varied, but the in-plane uniformity of film thickness can be improved under the condition that the electric power applied to the two targets 9a, 9b remains the same. Hence, the process setting for manufacturing can be unified, and the time to use up the target to its lifetime can be equalized. Thus, the production management can also be advantageously simplified.

Figure 8:
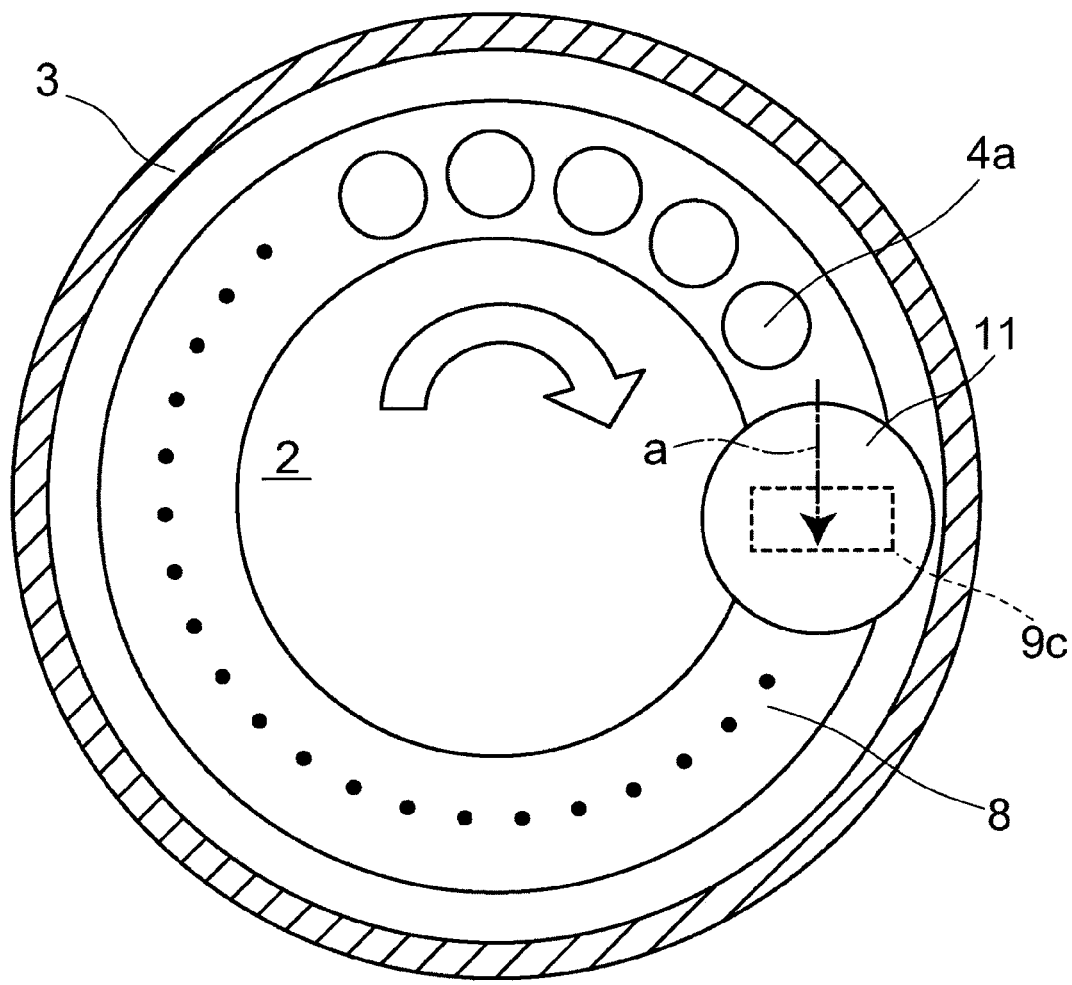
FIG. 8 is a schematic view showing the planar positional relationship between the rotary table and the sputter source in the case of using a rectangular target.

Next, FIG. 8 is a schematic view showing the planar positional relationship between the rotary table 8 and the sputter source 11 in the case of illustratively using a rectangular target 9c.

Figure 9:
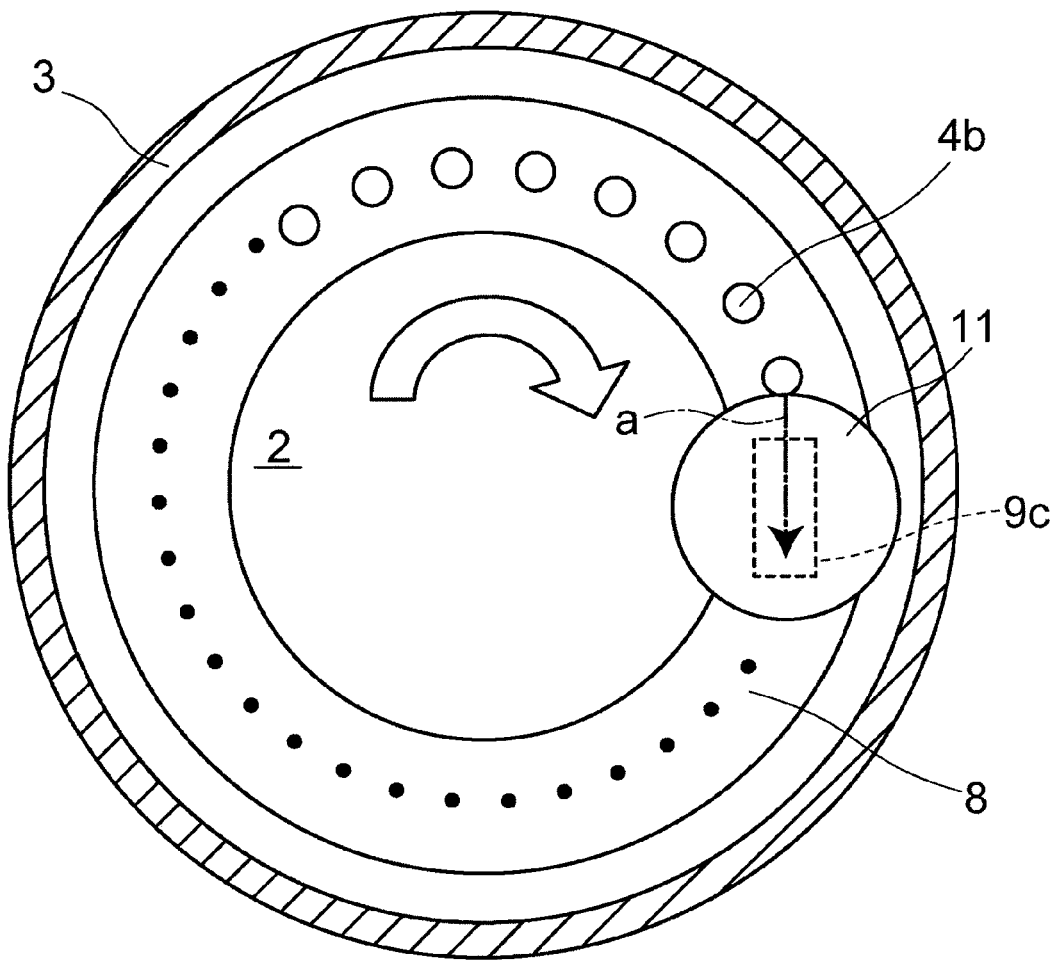
FIG. 9 is a figure corresponding to FIG. 8 and showing the case of performing film formation on a film formation object which is smaller in size (diameter) than that in FIG. 8.

FIG. 9 is a figure corresponding to FIG. 8 and showing the case of performing film formation on a film formation object which is smaller in size (diameter) than that in FIG. 8.

In the examples shown in FIGS. 8 and 9, the target held on the spinning sputter source 11 described above is a target 9c illustratively having a rectangular planar shape. Only the single rectangular target 9c is held on the sputter source 11.

Also in this example, the target area facing the film formation object can be varied by rotating (spinning) the sputter source 11.

In the case of performing film formation on a film formation object 4a having a relatively large size, as shown in FIG. 8, the longitudinal direction of the target 9c is made generally orthogonal to the moving direction a of the film formation object 4a passing below the sputter source 11. Hence, the target 9c is opposed also to the outer peripheral portion of the film formation object 4a. Thus, the in-plane uniformity of film thickness on the film formation object 4a is improved.

In the case of performing film formation on a film formation object 4b having a relatively small size, as shown in FIG. 9, the longitudinal direction of the target 9c is made generally parallel to the moving direction a of the film formation object 4b passing below the sputter source 11. Hence, the target area opposed to the outside of the film formation object 4b can be reduced. Thus, the wasteful film attached to portions other than the film formation object 4b can be decreased, and the utilization efficiency of the target is improved. This can also prevent contamination in the vacuum chamber 2 due to the film attached to portions other than the film formation object 4b, and reduce the frequency, time, and effort of maintenance. Furthermore, the film formation object 4b moves a long distance below the targets 9a, 9b and can be opposed to the targets 9a, 9b for a long period of time. Hence, the film formation rate can be increased.

The planar shape of the target in this example is not limited to a rectangle. Polygons having sides different in length, or ellipses also allow the target area facing the film formation object to be varied by rotation (spinning) of the sputter source 11.

Also in this example, the longitudinal direction of the target 9c is not limited only to the situations shown in FIGS. 8 and 9. More specifically, the situation in which the longitudinal direction of the target 9c is neither generally perpendicular nor generally parallel, but oblique to the moving direction a of the film formation object 4b, is also encompassed within the scope of the invention. The angle between the longitudinal direction of the target 9c and the line a can be suitably determined in accordance with the size of the film formation object 4b. As the size of the film formation object 4b becomes larger, the longitudinal direction of the target 9c and the line a can be made closer to orthogonality. On the other hand, as the size of the film formation object 4b becomes smaller, the longitudinal direction of the target 9c and the line a can be made closer to parallelism. That is, for an intermediate size of the film formation object 4b, the longitudinal direction of the target 9c and the line a may be neither parallel nor orthogonal. Furthermore, the spinning center of the sputter source 11 may be offset from its own central position, and is not limited to being located at the central position of the target 9c.

Second Embodiment

Figure 10:
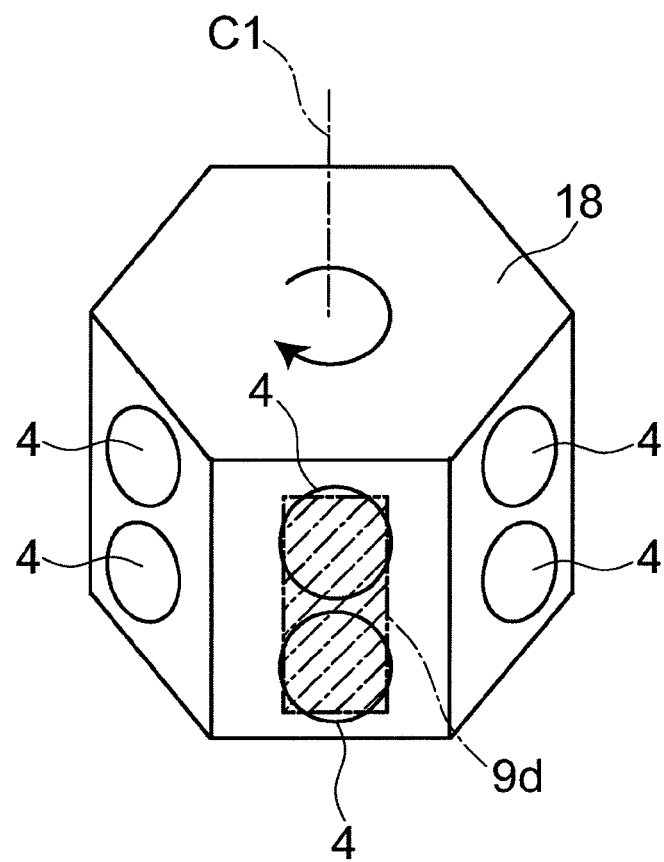
FIG. 10 is a schematic views of the configuration of the main part in a film forming apparatus according to a second embodiment of the invention.
Figure 11:
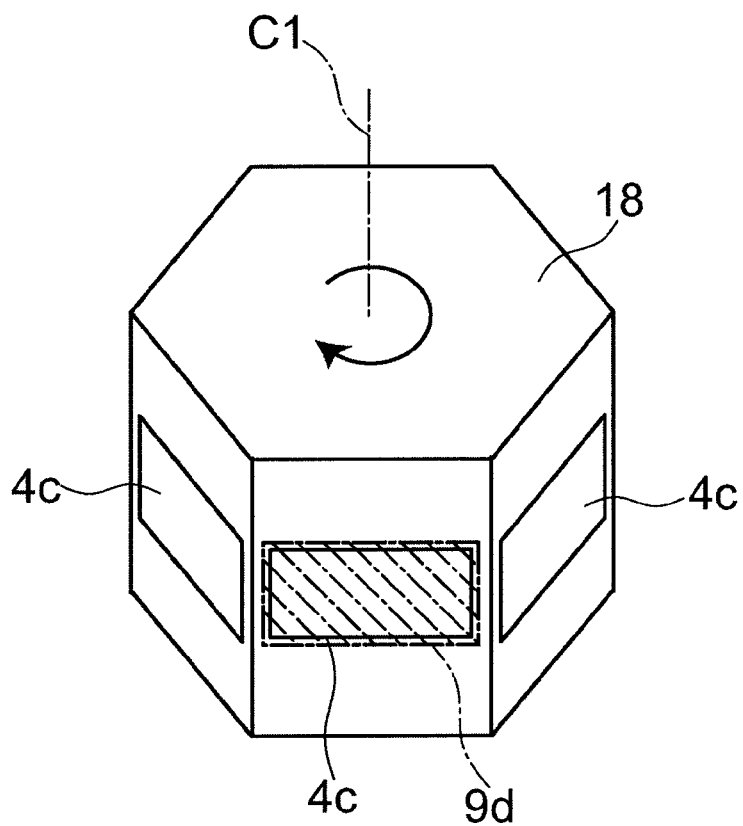
FIG. 11 is a figure corresponding to FIG. 10 and showing the case of performing film formation on a film formation object which is smaller in size (diameter) than that in FIG. 10.

FIGS. 10 and 11 are schematic views of the configuration of the main part in a film forming apparatus according to a second embodiment of the invention.

This embodiment uses a drum-shaped rotary table 18 rotatably disposed about the central axis C1 generally parallel to the vertical direction. A holder for a film formation object 4, 4c is provided on the side surface of this rotary table 18. Also in this embodiment, when the rotary table 18 rotates, the film formation object 4, 4c moves along a circular trajectory. A target 9d illustratively having a rectangular planar shape is opposed to the moving path. Like the above first embodiment, the target 9d is held on a sputter source (not shown) spinnably provided at a position opposed to the moving path of the film formation object. It is noted that the shape of the rotary table 18 is not limited to a polygonal drum, but may be a circular drum.

Also in this example, the target area facing the film formation object can be varied by rotating (spinning) the sputter source.

For example, as shown in FIG. 10, in the case where a plurality of film formation objects 4 are vertically arranged and held on the side surface of the rotary table 18, the longitudinal direction of the target 9d is aligned with the vertical direction in which the film formation objects 4 are arranged. Hence, the target 9d is opposed to all the plurality of film formation objects 4 arranged vertically. Thus, when the side surface (holder) of the rotary table passes through a position opposed to the target, the plurality of film formation objects 4 can be simultaneously subjected to film formation, and the efficiency is improved.

On the other hand, as shown in FIG. 11, for example, in the case of performing film formation on a rectangular film formation object 4c held on the side surface (holder) of the rotary table with the longitudinal direction being horizontal and the width direction being vertical, the longitudinal direction and the width direction of the target 9d are aligned with the longitudinal direction and the width direction of the film formation object 4c, respectively. Hence, the entire film formation area of the film formation object 4c can be opposed to the target 9d to achieve the in-plane uniformity of film thickness. Furthermore, the target area opposed to the outside of the film formation object 4c can be reduced. Thus, the wasteful film attached to portions other than the film formation object 4c can be decreased, and the utilization efficiency of the target is improved.

It is noted that in this embodiment using the drum-shaped rotary table 18, a plurality of sputter sources may be opposed to the moving path of the film formation object. Furthermore, a plurality of targets may be held on one sputter source.

Figure 12:
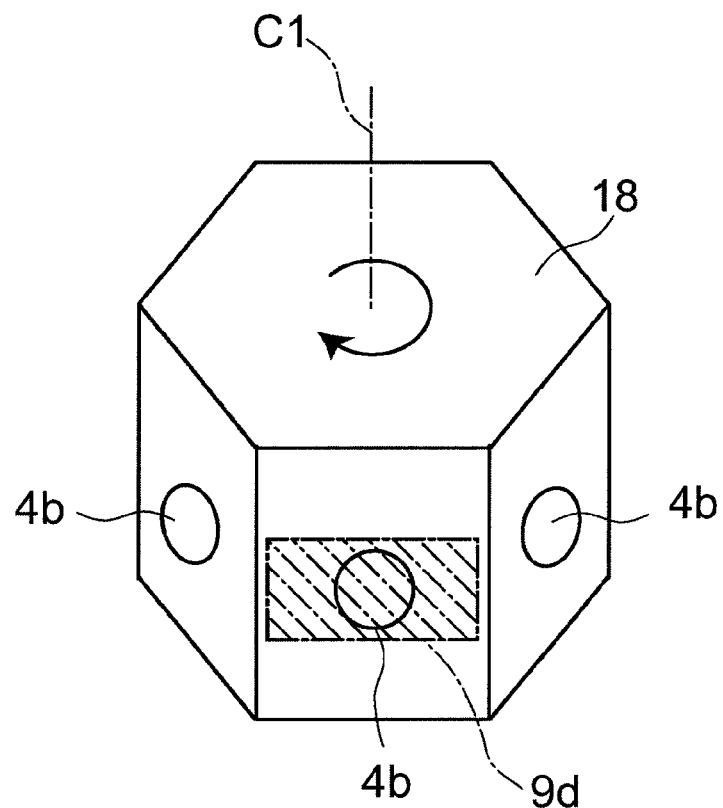
FIG. 12 is a schematic view showing another usage example in the film forming apparatus according to the second embodiment.
Figure 13:
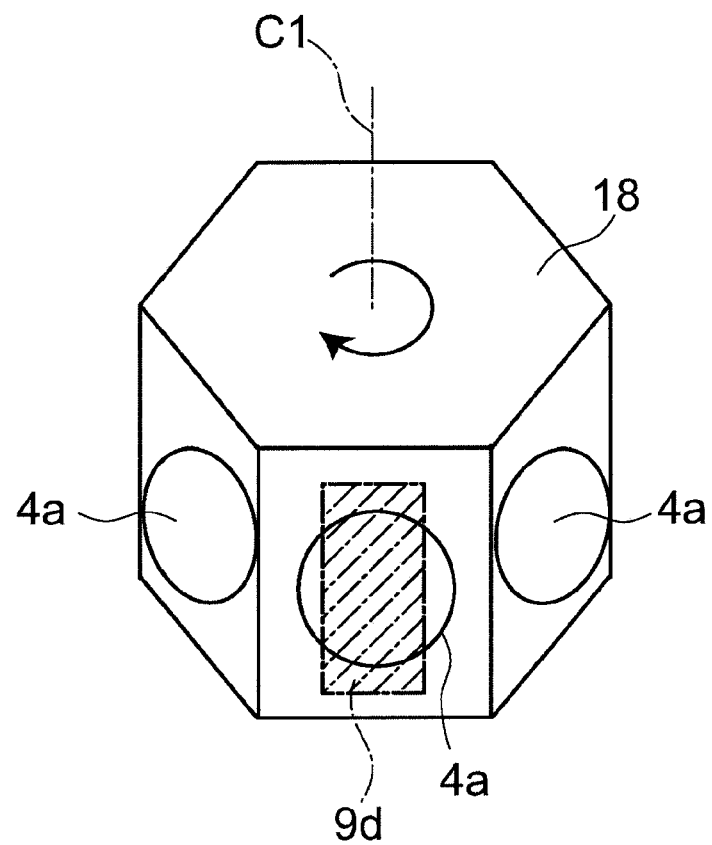
FIG. 13 is a schematic view showing still another usage example in the film forming apparatus according to the second embodiment.

Furthermore, the number of film formation objects held on the drum side surface may be one. In the case of a film formation object 4b having a relatively small size, as shown in FIG. 12, the longitudinal direction of the rectangular target 9d can be made generally parallel to the moving direction of the film formation object 4b to improve the film formation rate. In the case of a film formation object 4a having a relatively large size, as shown in FIG. 13, the longitudinal direction of the rectangular target 9d can be made generally orthogonal to the moving direction of the film formation object 4b to improve the in-plane uniformity of the film.

Figure 14:
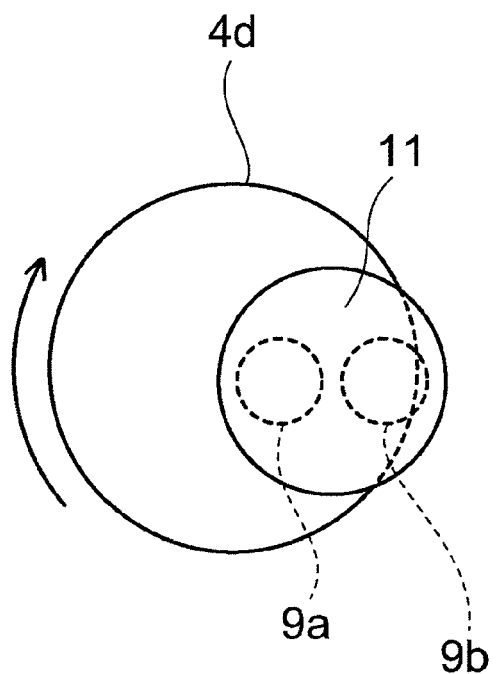
FIG. 14 is a schematic view showing the placement relationship of the target and the film formation object in the film forming apparatus according to another embodiment of the invention.
Figure 15:
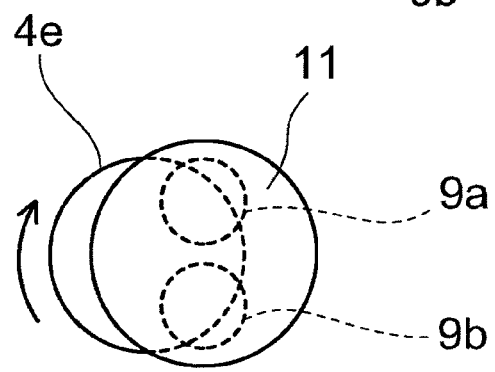
FIG. 15 is a schematic view showing the placement relationship of the target relative to the film formation object which is different in size from that in FIG. 14.

Furthermore, the film formation object may be spinnably disposed below the sputter source. As shown in FIG. 14, in the case of a film formation object 4d having a relatively large size, the two targets 9a, 9b can be arranged in the radial direction of the film formation object 4d and opposed thereto to improve the in-plane uniformity of the film. As shown in FIG. 15, in the case of a film formation object 4e having a relatively small size, the two targets 9a, 9b can be arranged in the tangential direction of the film formation object 4e to improve the film formation rate. It is noted that the spinning center of the film formation object 4d, 4e may be located at its own center, or at a position offset from its own center.

Industrial Applicability

According to the invention, a film forming apparatus and a film forming method are provided, which can perform uniform and efficient film formation in accordance with the size of a film formation object using a simple configuration, with less possibility of contamination and easy maintenance.

The invention claimed is:

1. A film forming apparatus comprising:
a rotary table having a holder for a film formation object and rotatably provided in a vacuum chamber; and
a sputter source provided at a position opposed to a moving path of the holder moved by rotation of the rotary table and holding a plurality of targets, and the sputter source being spinnable with facing the moving path,
the plurality of targets being linearly arranged, and a linearly arranged direction of the plurality of targets being changeable by the spin of the sputter source.

2. The film forming apparatus according to claim 1, wherein the distance from at least one target held on the sputter source to the holder can be varied.

3. The film forming apparatus according to claim 1 or 2, wherein electric power applied to the plurality of targets held on the sputter source is controllable for each target.

4. The film forming apparatus according to claim 3, wherein the target facing to an outer periphery side of the rotary table is nearer to the rotary table than the target facing to an inner periphery side of the rotary table.

5. The film forming apparatus according to claim 2, wherein the target facing to an outer periphery side of the rotary table is nearer to the rotary table than the target facing to an inner periphery side of the rotary table.

6. The film forming apparatus according to claim 1, wherein all of the plurality of targets are arranged on a single straight line passing each of the plurality of targets.

7. A film forming apparatus comprising:
a rotary table having a holder for a film formation object and rotatably provided in a vacuum chamber; and
a sputter source provided at a position opposed to a moving path of the holder moved by rotation of the rotary table and holding a target shaped like an ellipse or a polygon having sides different in length, the sputter source being spinnable with facing the moving path,
a longitudinal direction of the target being changeable by the spin of the sputter source.

8. The film forming apparatus according to claim 7, wherein all of the plurality of targets are arranged on a single straight line passing each of the plurality of targets.

9. A film forming method comprising holding a film formation object on a holder of a rotary table rotatably provided in a vacuum chamber and performing film formation on the film formation object using a sputter source spinnably provided at a position opposed to a moving path of the holder moved by rotation of the rotary table and holding a plurality of targets, the plurality of targets being linearly arranged, comprising:
changing a relative angle between the moving direction of the film formation object and a linearly arranged direction of the plurality of targets;
causing the plurality of targets to be arranged in the moving direction of the film formation object when the film formation object held on the holder has a first size; and
causing the plurality of targets to be arranged in the direction crossing the moving direction of the film formation object when the film formation object held on the holder has a second size larger than the first size.

10. A film forming method comprising holding a film formation object on a holder of a rotary table rotatably provided in a vacuum chamber and performing film formation on the film formation object using a sputter source spinnably provided at a position opposed to a moving path of the holder moved by rotation of the rotary table and holding a target shaped like an ellipse or a polygon having sides different in length, comprising:
changing a relative angle between the moving direction of the film formation object and a longitudinal direction of the target by the spin of the sputter source;
causing the longitudinal direction of the target to be relatively parallel or nearly parallel to the moving direction of the film formation object when the film formation object held on the holder has a first size; and
causing the longitudinal direction of the target to be relatively orthogonal or nearly orthogonal to the moving direction of the film formation object when the film formation object held on the holder has a second size larger than the first size.

* * * * *